(12) United States Patent
Stenfort et al.

(10) Patent No.: US 6,966,022 B1
(45) Date of Patent: Nov. 15, 2005

(54) SYSTEM AND METHOD FOR DETERMINING INTEGRATED CIRCUIT LOGIC SPEED

(75) Inventors: Ross Stenfort, San Jose, CA (US); Tianshu Chi, San Jose, CA (US)

(73) Assignee: Adaptec, Inc., Milpitas, CA (US)

( * ) Notice: Subject to any disclaimer, the term of this patent is extended or adjusted under 35 U.S.C. 154(b) by 459 days.

(21) Appl. No.: 10/116,922

(22) Filed: Apr. 4, 2002

(51) Int. Cl.$^7$ .......................... G01R 31/00; H03L 7/00; G11C 8/00
(52) U.S. Cl. ...................... 714/745; 327/141; 365/233
(58) Field of Search ............................... 714/718, 700, 714/745; 327/270, 141; 365/233

(56) References Cited

U.S. PATENT DOCUMENTS

| | | | |
|---|---|---|---|
| 5,959,487 A | * | 9/1999 | Kawamura .................. 327/270 |
| 6,414,903 B1 | * | 7/2002 | Keeth et al. ................ 365/233 |
| 2002/0188899 A1 | * | 12/2002 | Yamazaki ................... 714/718 |

FOREIGN PATENT DOCUMENTS

| | | | | |
|---|---|---|---|---|
| JP | 04331383 A | * | 12/1990 | .......... G01R 31/26 |
| JP | 04350580 A | * | 5/1991 | .......... G01R 31/28 |

OTHER PUBLICATIONS

"Picoseconds Measurement of Internal Waveforms in Integrated Circuits Using Sampling Force Probing. I. Principle and Demonstration" Said, R.A. International Symposium on Circuits and Systems, ISCAS 2000 Publication: May 28-31, 2000 p. 681-684 vol. 2.*

* cited by examiner

Primary Examiner—Albert Decady
Assistant Examiner—Cynthia Britt
(74) Attorney, Agent, or Firm—Martine Penilla & Gencarella, LLP

(57) ABSTRACT

An invention is disclosed for determining integrated circuit (IC) logic speed. A storage element is provided that includes a reset input in electrical communication with a reset pin. A reset signal is then asserted at the reset pin, and a reset time is measured. The reset time is defined as the time period beginning when the reset signal is asserted and ending when the storage element resets. In this manner, the reset time can be used to determine a speed of the IC logic relative to a process. In one aspect, delay logic is provided that is in electrical communication with the reset pin and in electrical communication with the storage element. In this aspect, the delay logic delays the reset signal for a predetermined time period. Optionally, the reset time can be compared to a predetermined fast corner reset time and a predetermined slow corner reset time. Further, the IC logic speed can be correlated to a simulation using the embodiments of the present invention.

19 Claims, 6 Drawing Sheets

SYSTEM AND METHOD FOR DETERMINING INTEGRATED CIRCUIT LOGIC SPEED

BACKGROUND OF THE INVENTION

1. Field of the Invention

This invention relates generally to integrated circuit testing, and more particularly to methods for determining logic speed in integrated circuits.

2. Description of the Related Art

Integrated circuits (ICs) are the cornerstones of myriad computational systems, such as personal computers and communications networks. As such, purchasers of such systems have come to expect significant improvements in speed performance over time, which encourages system designers to select ICs that guarantee superior speed performance. In an effort to increase chip speed, quality, and density of internal circuit components, chip manufacturers often attempt to maximize fault coverage when testing their IC designs. A common industry design practice is to make the IC design scannable by implementing scan cells. Among many types of scan cells, the most common scan cell is the "muxed-scan," or also referred to herein as a "scan flop."

FIG. 1A illustrates a conventional scan flop 100 having a multiplexer 102 and a D flip flop 104. Generally, the scan flop 100 has a system data input (DI) and a scan data input (SI) that are respectively connected to the multiplexer 102. The muliplexer 102 is configured to receive a scan enable (SE) and output a signal to a D input of the D flip-flop 104. The scan flop 100 also receives a clock signal (CP), which is communicated to the D flip-flop 104. In addition, output pins Q and NQ are also selectively output from the D flip-flop 104. The scan flop is therefore configured to operate in one of two modes. The first mode is a "system" mode (also known as the functional mode), and the second mode is a "scan" mode (also known as the test mode).

FIG. 1B illustrates a simplified semiconductor chip 101 having a scan chain that is made up of a plurality of interconnected scan flops 100. In actuality, when a full-scan design is implemented for a semiconductor chip 101, many more scan chains are integrated into the IC design to enable the scan test to achieve the highest fault coverage. However, for this simplified example, the scan data input (SI) of the first scan flop 100 of the scan chain is connected to a pad 110, and the output pin Q of the last scan flop 100 is connected to a pad 112. Also shown is a clock (CLK) pad connected to each of the clock signals (CP) of the individual scan flops 100. The output pins Q of each scan flop 100 of the scan chain are connected to the scan data input (SI) of a subsequent scan flop 100. In this common scan chain design, non-scan chain logic 106 is also connected to the output pins Q and the scan data inputs (SI). Additionally, non-scan chain logic 106 may be connected to the output pins NQ.

When the scan flop 100 is in the system mode, the scan enable (SE) signal is constrained to ground, such that the scan flop 100 operates identically to the D-flip-flop 104. In the scan mode, the scan enable (SE) signal is active high in shifting. In general, a test vector is scanned into each one of the scan flops 100 one clock at a time. Therefore, if a particular scan chain has one thousand scan flops 100, the scan chain would take one thousand clock shifting cycles to load.

Although, the above described scan cell testing model can provide good fault coverage when testing IC designs, chip manufacturers often need to test all process corners to avoid later system errors. As is well known, ICs are comprised of logic gates. However, the speed of the logic gates can vary from one IC to another because of silicon manufacturing process variances. As a result, ICs need to be tested to determine the speed, relative to the process, of each chip. Moreover, variances in operating voltage can affect the speed of an IC. Hence, ICs need to be tested to determine the affect various voltage levels have on the operating speed of each IC.

In addition to scan cells as described above, ring oscillation has been used to test IC speed. FIG. 2 is a schematic diagram showing a conventional ring oscillator 200. The ring oscillator 200 includes an inverter 202 coupled to a plurality of buffers 204, wherein the output of the last buffer 204 provides feedback to the input of the inverter 202. Generally, an odd number of inverters 202 and buffers 204 are used in order to oscillate the output signal at output pin 206 during operation. Hence, the inverter 202 inverts a signal applied to its input and provides the inverted signal to the buffers 204. The last buffer 204 feeds the inverted signal back to the inverter 202, which inverts the signal again, thus providing signal oscillation.

To test the IC speed, the output pin 206 is monitored to determine the frequency of the oscillation. The frequency can then be used to determine the speed of the IC. Unfortunately, the ring oscillator approach is complicated and highly layout dependent. For example, an extra output pin 206 is required, or a mux needs to be applied to an existing pin. In addition, the number of buffers and the size of the buffers must be determined based on the exact IC layout and existing RC delays, and space must be reserved for each ring oscillator used. These determinations require a great deal of planning and experimentation to generate the desired results.

In addition to ring oscillation, functional test vectors have been used to determine IC logic speed. In this technique, a functional test vector is run at speed to determine how fast the IC will operate. Unfortunately, several problems are associated with the approach. First, the composition of the test vector must be well planed in order for proper testing, thus again requiring a great deal of planning and experimentation to generate the desired results. Second, the testor used to test the IC must be able to drive the inputs and measure the outputs of the IC fast, often faster than many testor can operate. Third, the determination of the whether the test passed or failed is often difficult to establish, and further passing or failing only provides one threshold for sorting IC devices. For example, if parts A, B, and C all pass, there is no way to determine the relationships between the parts and there is no way to relate their passing to simulations. Moreover, there is no way to determine how fast the parts are or how slow they are.

In view of the foregoing, there is a need for methods for determining IC speeds relative to a process. The methods should allow determination of the affect of voltage changes on the ICs and should further allow correlation of ICs, within a particular process, into various speed grades. Further, the methods should be non-layout specific and relatively easy to implement and utilize.

SUMMARY OF THE INVENTION

Broadly speaking, the present invention fills these needs by providing techniques for determining IC logic speed using an asynchronous reset signal having a predetermined delay applied before connecting to a final scan flop of a scan chain. In this manner, an accurate IC speed can be determined based on the time period occurring before the final scan flop resets. In one embodiment, a method is disclosed for determining integrated circuit (IC) logic speed. A storage element is provided that includes a reset input in electrical communication with a reset pin. A reset signal is then asserted at the reset pin, and a reset time is measured. The reset time is defined as the time period beginning when the reset signal is asserted and ending when the storage element resets. In this manner, the reset time can be used to determine a speed of the IC logic relative to a process. Optionally, the reset time can be compared to a predetermined fast corner reset time and a predetermined slow corner reset time. Further, the IC logic speed can be correlated to a simulation using the embodiments of the present invention. Also optionally, an operating condition, such as voltage or temperature, of an IC having the storage element can be altered, and a reset time can be measured for the IC when it is run using the altered operating condition. In this aspect, the IC can be assigned a speed rating based on each operating condition.

In an additional embodiment, an IC having testing logic for determining IC logic speed is disclosed. The IC includes a storage element having a data input, a reset input, and a data output in electrical communication with an output pin. In addition, delay logic is included in the IC. The delay logic is in electrical communication with the reset input of the storage element and also in electrical communication with a reset pin. The delay logic is capable of delaying a reset signal from the reset pin for a predetermined time period. In operation, the reset signal is asserted at the reset pin, and a reset time is measured. As above, the reset time is defined as the time period beginning when the reset signal is asserted and ending when the storage element resets. In one aspect, the storage element can be the last scan cell in a scan chain, wherein the scan chain includes a plurality of scan cells. In this aspect, a majority of the scan cells include an output coupled to an input of a subsequent scan cell in the scan chain. As above, one application of the above IC logic speed determination is to compare the reset time to a predetermined fast corner reset time and a predetermined slow corner reset time for the IC design.

A scan chain system for determining integrated circuit (IC) logic speed is disclosed in a further embodiment of the present invention. The scan chain system includes a plurality of scan cells, with each scan cell having a data input, a data output, and a reset input. In addition, the plurality of scan cells includes a first scan cell having a data input connected to a data input line, and a last scan cell having a data output connected to a data output line. The scan chain system further includes delay logic connected to a reset line and the reset input of the last scan cell. The delay logic is capable of delaying a reset signal from the reset line for a predetermined time period before providing the reset signal to the reset input of the last scan cell. In operation, the reset signal is asserted at the reset line, and a reset time is measured. As mentioned previously, the reset time is defined as the time period beginning when the reset signal is asserted and ending when the last scan cell resets.

The delay logic of the embodiments of the present invention increases the delay time between asserting the reset signal and the actual reset of the last scan cell storage element such that it is easily measurable, with more granularity. Because the delay logic increases the delay time such that it is easily measurable with more granularity, embodiments of the present invention advantageously can correlate ICs within a particular process, into various speed grades.

Thus, embodiments of the present invention allow ICs to be sorted according to logic speed. In addition, ICs can be sorted based on speed as related to varying operating conditions, such as voltage or temperature. For example, ICs can be speed sorted based on voltage variances, where each IC can be given specific speed ratings for a plurality of operating voltages. In addition, the embodiments of the present invention can be utilized to validate IC simulations with actual ICs. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for determining IC logic speed using an asynchronous reset signal having a predetermined delay applied before connecting to a final scan flop of a scan chain. In this manner, an accurate IC speed can be determined based on the time period occurring before the final scan flop resets. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1A:
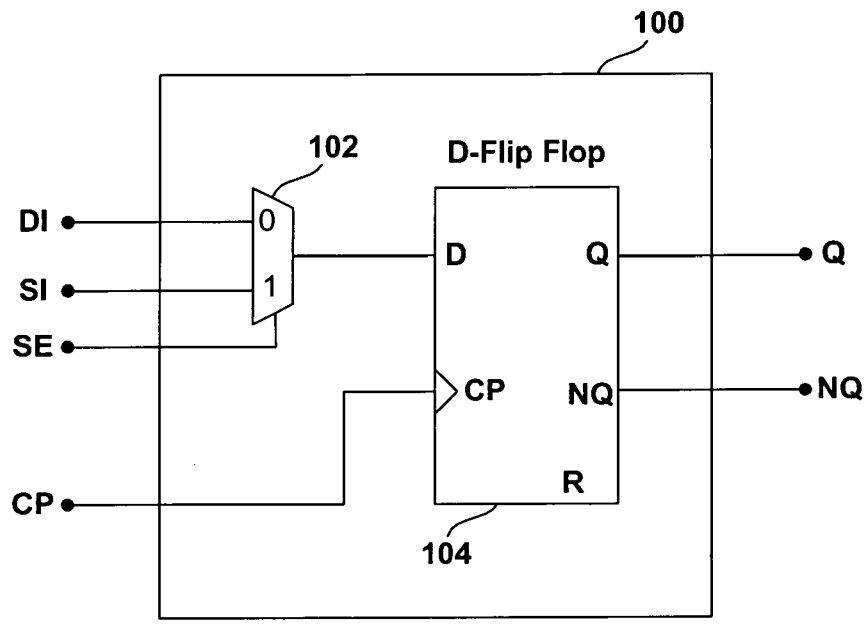
FIG. 1A illustrates a conventional scan flop having a multiplexer and a D flip flop.
Figure 1B:
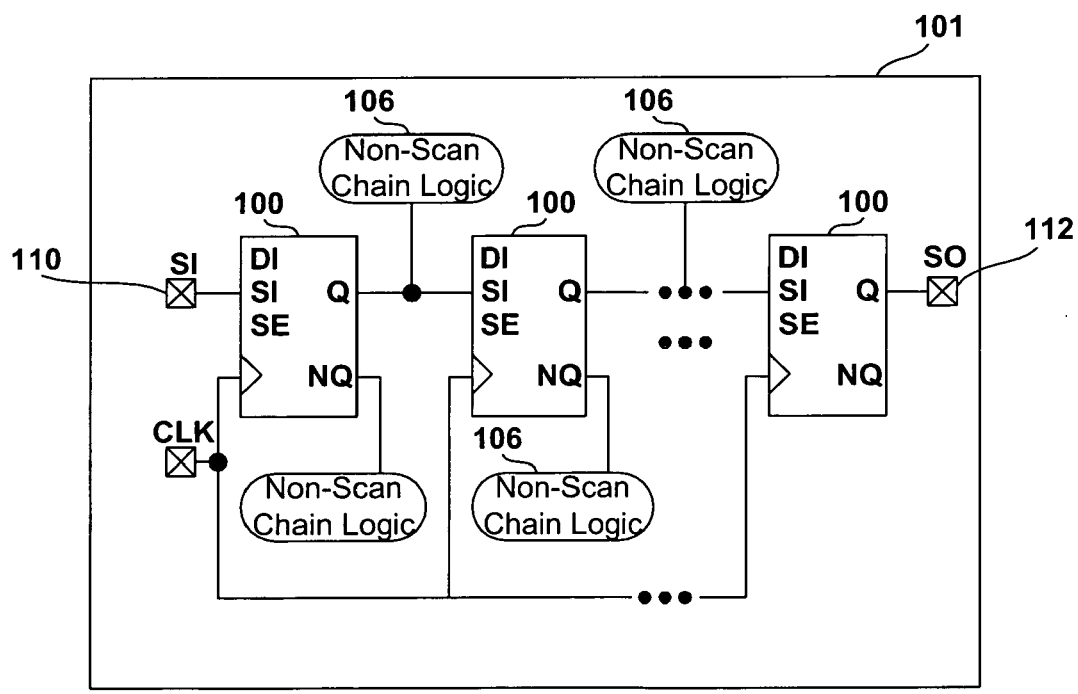
FIG. 1B illustrates a simplified semiconductor chip having a scan chain that is made up of a plurality of interconnected scan flops.
Figure 2:
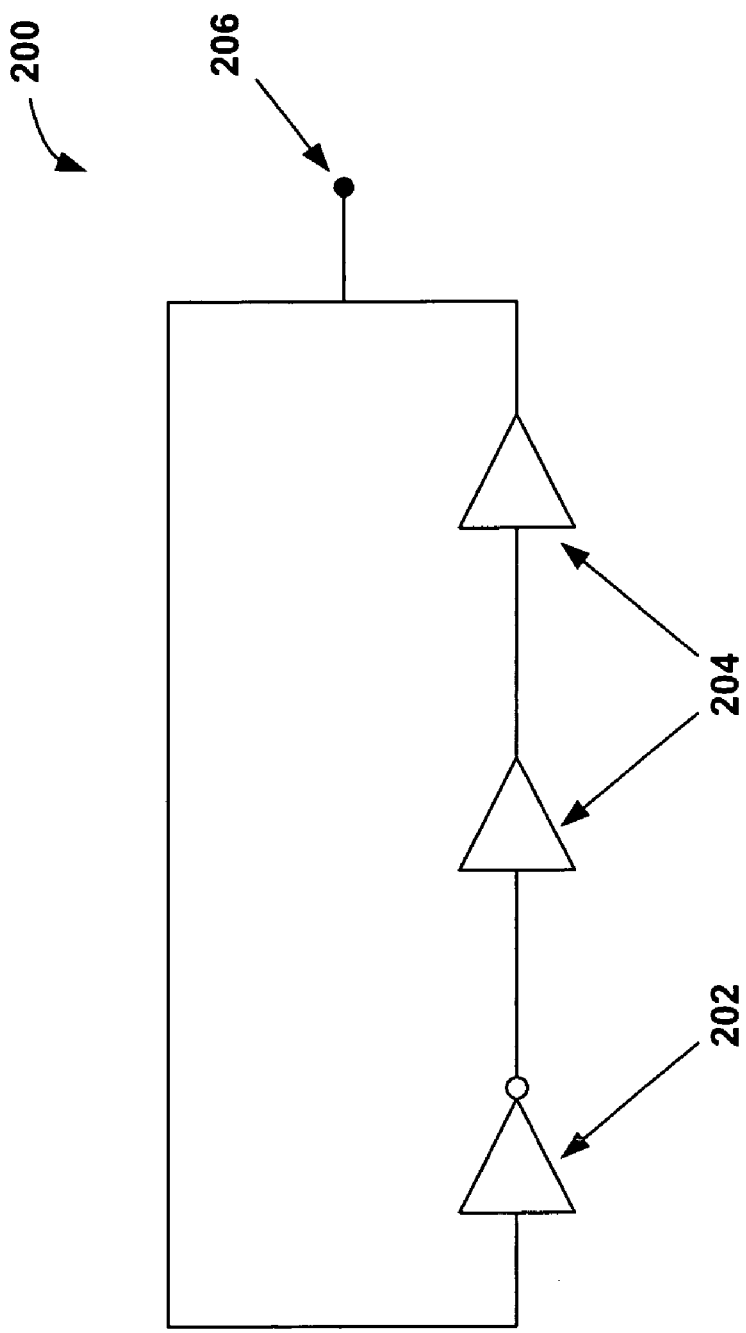
FIG. 2 is a schematic diagram showing a conventional ring oscillator.
Figure 3:
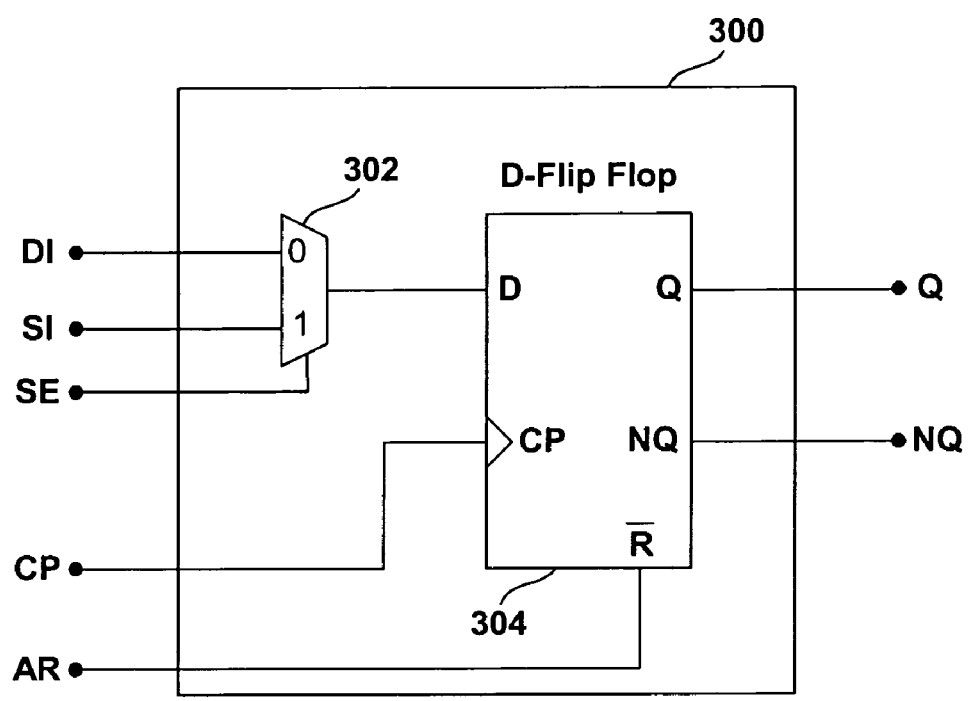
FIG. 3 is a schematic diagram showing a scan flop configured for asynchronous reset, in accordance with an embodiment of the present invention.

FIGS. 1A, 1B, and 2 were described in terms of the prior art. FIG. 3 is a schematic diagram showing a scan flop 300 configured for asynchronous reset, in accordance with an embodiment of the present invention. The scan flop 300 includes a multiplexer 302 coupled to a D flip flop 304. In particular, the multiplexer 302 is connected to a system data input (DI) and a scan data input (SI), and is configured to receive a scan enable (SE), and output a signal to a D input of the D flip-flop 304.

The scan flop 300 also receives a clock signal (CP) and an asynchronous reset signal (AR), which are communicated to the D flip-flop 304. Further, output pins Q and NQ are selectively output from the D flip-flop 304. Hence, the scan flop is configured to operate in one of two modes, namely, a "system" mode (also known as the functional mode), and a "scan" mode (also known as the test mode).

As described in greater detail subsequently, the asynchronous reset signal AR is utilized in the embodiments of the present invention to facilitate determination of the IC logic speed. Broadly speaking, an asynchronous reset from an external pin is sent through delay logic before being applied to the reset input of the last scan flop of the scan chain. The scan output pin is then monitored to determine when the last scan flop resets. The IC logic speed can then be determined based on the time period beginning when the reset signal is applied to the external reset pin and ending when the last scan flop resets.

Figure 4:
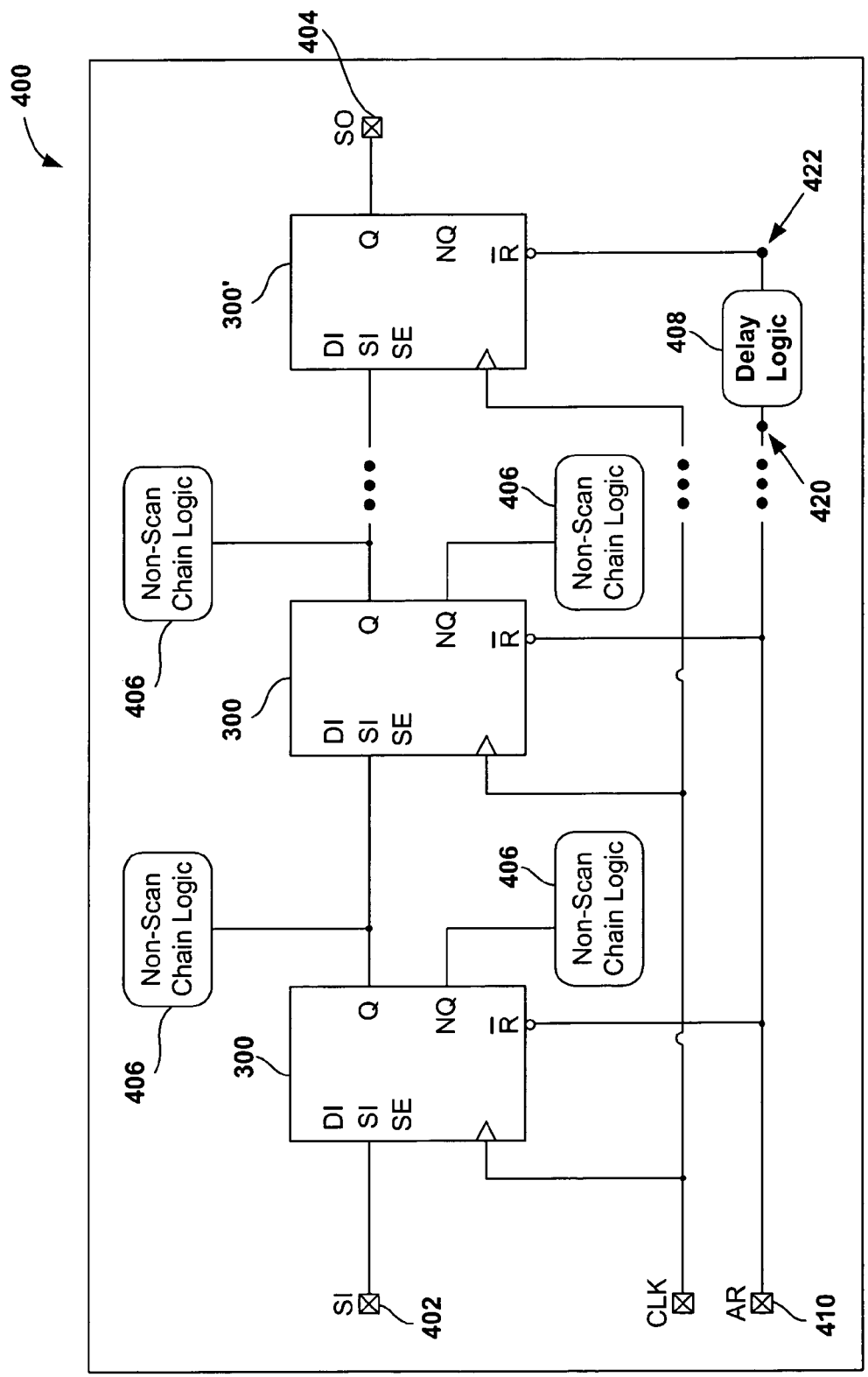
FIG. 4 is a schematic diagram showing a semiconductor chip having an asynchronous reset scan chain for determining IC logic speed, in accordance with an embodiment of the present invention.

FIG. 4 is a schematic diagram showing a semiconductor chip 400 having an asynchronous reset scan chain for determining IC logic speed, in accordance with an embodiment of the present invention. It should be noted that when a full-scan design is implemented for a semiconductor chip 400, many more scan chains containing flip flops with an asynchronous reset are integrated into the IC design to enable the scan test to achieve the highest fault coverage. However, for this example, the scan data input (SI) of the first scan flop 300 of the scan chain is connected to a scan input pad 402, and the output pin Q of the last scan flop 300' is connected to a scan output pad 404.

Also shown is a clock (CLK) pad connected to each of the clock signals (CP) of the individual scan flops 300. The output pins Q of each scan flop 300 of the scan chain are connected to the scan data input (SI) of a subsequent scan flop 300. Further, non-scan chain logic 406 is connected to the output pins Q and the scan data inputs (SI). Additionally, non-scan chain logic 406 may be connected to the output pins NQ.

As mentioned previously, when the scan flop 300 is in the system mode, the scan enable (SE) signal is constrained to ground, such that each scan flop 300 operates identically to the D-flip-flop 304. In the scan mode, the scan enable (SE) signal is active high in shifting, and a test vector is scanned into each one of the scan flops 300 one clock at a time. Using the above described configuration, embodiments of the present invention can maximize fault coverage when testing IC designs. In addition, embodiments of the present invention can accurately test IC logic speed relative to a process, using a delayed reset signal.

Specifically, each scan flop 300 includes an active low reset input $\overline{R}$ that is connected to an asynchronous reset pad 410. Further, delay logic 408 is inserted between the asynchronous reset pad 410 and the reset input of the last scan flop 300'. In one embodiment, the delay logic 408 comprises a plurality of gates selected to produce a desired predetermined delay along the reset line. For example, the delay logic can include a plurality of inverters or buffers, or both or other gates that are logically equivalent in implementations. It should be noted that the delay logic 408 does not affect the performance of the IC either during normal "system" mode or during "scan" mode because the delay logic 408 is located along the reset line.

To test the IC logic speed, a scan pattern is scanned into the scan flops 300 of the scan chain such that a logical 1 is scanned into the last scan flop 300' of the scan chain. Since a plurality of different scan patterns typically are used to perform general scan tests, test engineers can select a preexisting scan pattern that will scan a logical 1 into the last scan flop 300'. However, it should be noted that any scan pattern can be scanned into the scan flops 300 of the scan chain and stopped when an expected logical 1 is reached in the last scan flop 300'. Further, it should be noted that specific scan patterns can also be developed specifically for testing IC logic speed.

Once a logical 1 is scanned into the last scan flop 300', the asynchronous reset signal can be asserted using the asynchronous reset pad 410. Once asserted, the last scan flop 300' will reset when the asserted reset signal reaches the reset input of the last scan flop 300', after being delayed by the delay logic 408. Thus, to test the IC logic speed, embodiments of the present invention determine a scan chain reset time, which is defined as the time period beginning when the reset signal is asserted and ending when the scan output SO 404 goes low, indicating the last scan flop 300' has been reset. Generally, the majority of the scan chain reset time results from the delay logic 408.

As is well known, when ICs are manufactured process differentiation occurs between the fabrication processes, resulting in IC fast and slow corners. Hence, a gate within one chip can function at a different speed than the same gate in another chip, even though both chips are on the same wafer and manufactured using the same process. Moreover, if an IC design has a fast corner of 1 ns, it is not unusual to have a slow corner of 4 ns.

It should be noted that ICs falling in different corners are run under the same operating parameters, such as under the same frequency and voltage, yet the device speeds can still vary. Thus, embodiments of the present invention can determine whether a particular IC falls within the fast corner or the slow corner of a process. In addition, since the actual speed of an IC can be measured using the embodiments of the present invention, each IC can be located along a speed curve for the particular process.

For example, since the delay logic 408 and relevant RC delays are known, the IC design can be simulated, using for example SPICE, to determine the slow corner scan chain reset time and the fast corner scan chain reset time. That is, test engineer can simulate the time required for the reset signal from the AR pad 410, through the predefined delay logic 408, to the last scan flop 300', and then the time required to see the output Q of the last scan flop 300' go low, for both the fast corner and the slow corner.

Thus, using X to represent the slow corner speed and Y to represent the fast corner speed, the test engineer knows that if the IC falls within the slow corner, the scan chain reset time will be X, and if the IC falls within the fast corner, the scan chain reset time will be Y. The test engineer can then determine the actual scan chain reset time for the particular IC relative to X and Y. Using this information, the test engineer can determine whether the IC logic speed correlates to the IC libraries and simulation information for the particular IC. That is, the actual scan chain reset time for the IC should be within the slow corner and fast corner boundaries for the IC. In addition, because the scan chain reset time can be specifically tested, the test engineer can determine where the IC is located along a speed curve for the particular process.

Figure 5:
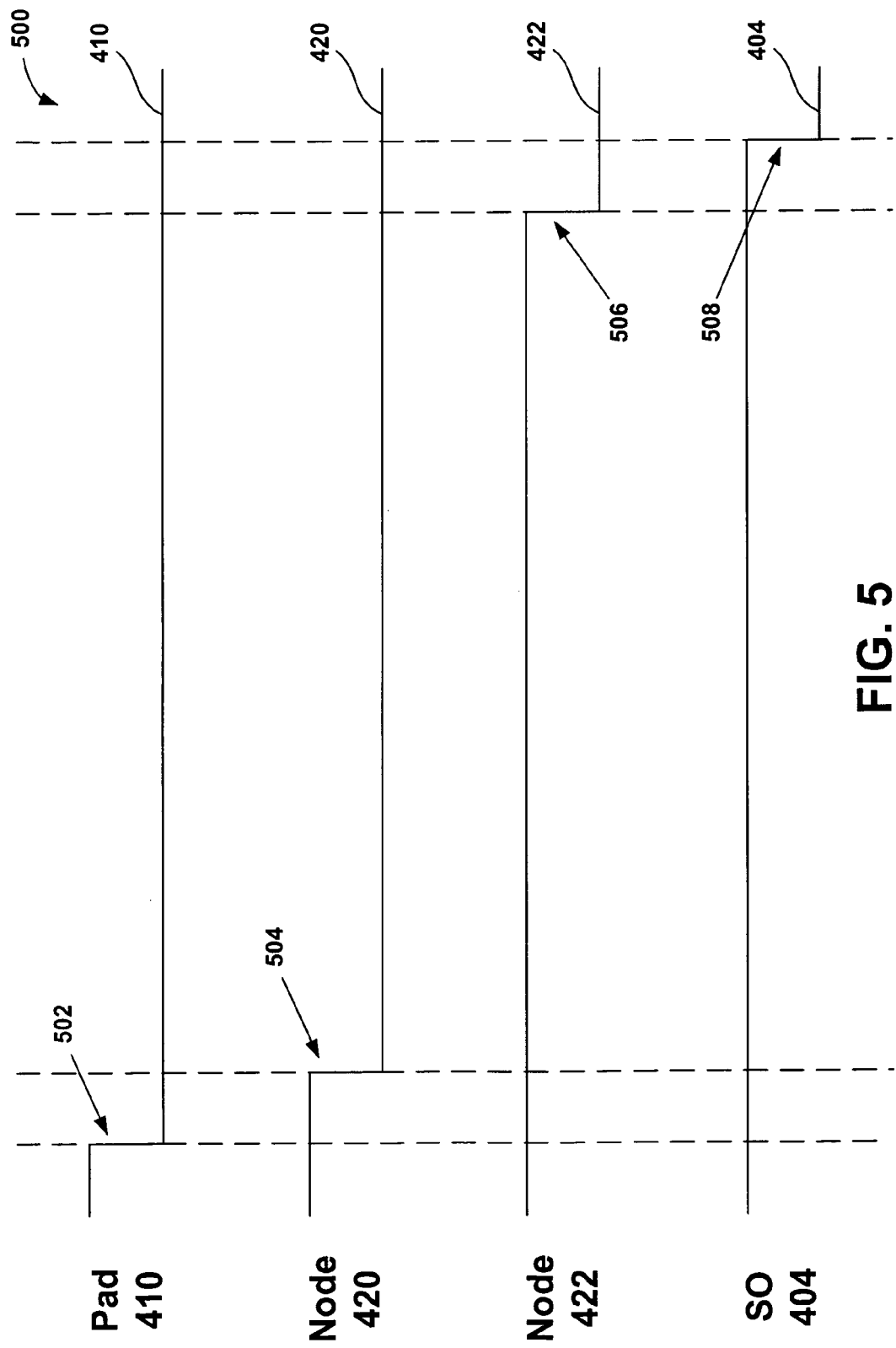
FIG. 5 is a timing diagram showing reset signal timing at various nodes along the reset line, in accordance with an embodiment of the present invention.

FIG. 5 is a timing diagram 500 showing reset signal timing at various nodes along the reset line, in accordance with an embodiment of the present invention. More particularly, the timing diagram 500 illustrates exemplary reset signal levels at the AR pad 410, node 420, node 422, and the SO pad 404, once the reset signal has been asserted. As shown in FIG. 4, node 420 is located immediately before the delay logic 408, and node 422 is located immediately after the delay logic 408. These nodes are used herein to illustrate the timing delay elements of the embodiments of the present invention.

Referring back to FIG. 5, when the AR signal is asserted, the reset signal at the AR pad 410 goes low at point 502. Next, after a small RC delay along the reset line, node 420 goes low at point 504. Generally, the RC delay between point 502 and point 504 is small, typically in the range of about 2–3 nanoseconds (ns). Thereafter, the delay logic delays the reset signal for a predetermined time period before the reset signal reaches node 422, at point 506. The signal at the SO pad 404 then goes low after the last scan flop 300' resets, at point 508. As with the RC delay described above, the delay between point 506 and point 508 is small, generally in the range of about 2–3 nanoseconds (ns).

As can be seen from the timing graph 500, the delay is very small between point 502 and point 504, and between point 506 and point 508. Thus, the delay logic 408 is utilized to increase the delay time between point 502 and point 508 such that it is easily measurable, with more granularity. For example, the delay logic can be implemented such that if the IC falls within the slow corner, node 422 may go low at about 100 ns from point 504, while if the IC falls within the fast corner, node 422 may go low at about 20 ns from point 504. Because the delay logic 408 increases the delay time between point 502 and point 508 such that it is easily measurable with more granularity, embodiments of the present invention advantageously can correlate ICs within a particular process, into various speed grades.

As is well known, ICs often operate at different speeds depending on the operating conditions under which they are run. For example, ICs can be made to operate at increased speeds by raising the operation voltage of the IC. For example, a typically operating voltage of about 1.8V can be increased, for example, by about 5% V. The 5% voltage increase can increase the operating speed of an IC by about 10%, which is significant. Conversely, a 5% reduction in voltage generally reduces an IC operating speed more than 15%. Using the embodiments of the present invention, each individual IC can be timed to determine the actual speed increase from a particular voltage increase. In a similar manner, IC temperature can affect the IC's speed.

In addition, the timing information obtained using the embodiments of the present invention can further be used to adjust simulations to better correlate them to individual ICs. Although, an approximation of the speed increase can be determined using SPICE simulations, the silicon should be correlated to the simulations to check the accuracy of the simulations. Using the embodiments of the present invention, the test engineer can increase the operating voltage of an IC, and then compare the new scan chain reset time to the scan chain reset time from the nominal voltage. The comparison can be used to calculate the speed increase from the operating voltage increase for the particular IC.

Using the embodiments of the present invention, allows ICs to be sorted according to speed. In addition, ICs can be speed sorted based on voltage variances or temperature variances. For example, each IC can be given specific speed ratings for a plurality of operating voltages and/or operating temperatures. In addition, the embodiments of the present invention can be utilized to validate IC simulations with actual ICs.

Figure 6:
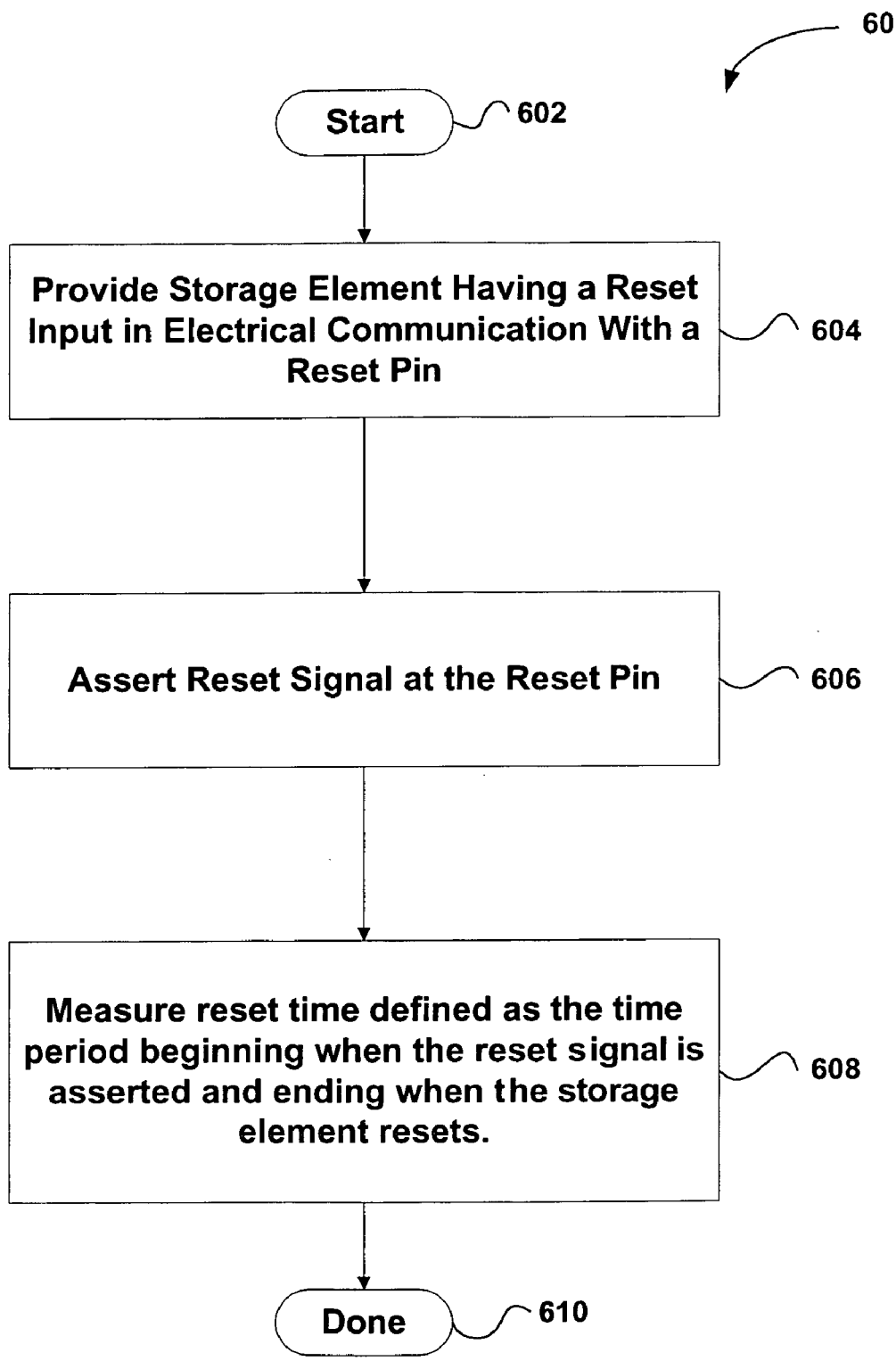
FIG. 6 is a flowchart showing a method for determining IC logic speed, in accordance with an embodiment of the present invention.

FIG. 6 is a flowchart showing a method for determining IC logic speed, in accordance with an embodiment of the present invention. In an initial operation 602, preprocess operations are performed. Preprocess operations can include IC design, IC simulation, and other preprocess operations that will be apparent to those skilled in the art after a careful reading of the present disclosure.

In operation 604, a storage element is provided that includes a reset input in electrical communication with a reset pin. As mentioned previously, when implementing a full-scan design for a semiconductor chip, many more asynchronous reset scan chains are integrated into the IC design to enable the scan test to achieve the highest fault coverage. However, for purposes of illustration, the storage element is the last scan flop of a scan chain. Generally, the SI of the first scan flop of the scan chain is connected to the scan input pad, and the output pin Q of the last scan flop storage element is connected to a scan output pad. The output pins Q of each scan flop of the scan chain are connected to the SI of a subsequent scan flop. Non-scan chain logic can be connected to the output pins Q and the scan data inputs. Additionally, non-scan chain logic may be connected to the output pins NQ.

Using the above described configuration, embodiments of the present invention can maximize fault coverage when testing IC designs. In addition, embodiments of the present invention can accurately test IC logic speed relative to a process, using a delayed reset signal. In particular, each scan flop includes a reset input that is connected to the asynchronous reset pin. Further, delay logic can be inserted between the asynchronous reset pin and the reset input of the last scan flop storage element. In one embodiment, the delay logic comprises a plurality of gates selected to produce a desired predetermined delay along the reset line. For example, the delay logic can include a plurality of inverters or buffers, or both.

In operation 606, the reset signal is asserted at the reset pin. Prior to asserting the reset pin, a scan pattern is scanned into the scan flops of the scan chain such that a logical 1 is scanned into the last scan flop storage element. Since a plurality of different scan patterns typically are used to perform general scan tests, test engineers can select a preexisting scan pattern that will scan a logical 1 into the last scan flop. However, it should be noted that any scan pattern can be scanned into the scan flops of the scan chain and stopped when an expected logical 1 is reached in the last scan flop. Further, it should be noted that specific scan patterns can also be developed for testing IC logic speed. Once a logical 1 is scanned into the last scan flop, the asynchronous reset signal can be asserted using the asynchronous reset pin. The last scan flop will reset when the asserted reset signal reaches the reset input of the last scan flop, after being delayed by the delay logic.

In operation 608, a reset time is measured that is defined as the time period beginning when the reset signal is asserted and ending when the storage element resets. Generally, the scan output SO is monitored to determine when it goes low, indicating the last scan flop storage element has been reset. Typically, the reset time is very small when delay logic is not present in a chip. Thus, the delay logic is utilized to increase the delay time between asserting the reset signal and the actual reset of the last scan cell storage element such that it is easily measurable, with more granularity. As mentioned previously, embodiments of the present invention advantageously can correlate ICs within a particular process into various speed grades because the delay logic increases the delay time such that it is easily measurable with more granularity. In addition, it should be noted that Q can be connected to SO instead of Q. In such as case, SO can be monitored to determine when it goes high, indicating the last scan flop storage element has been reset.

Post process operations are performed in operation 610. Post process operations can include further IC logic speed tests, IC correlation with simulations, IC logic speed correlation based on operating voltages, and other post process operations that will be apparent to those skilled in the art after a careful reading of the present disclosure. Thus, embodiments of the present invention allow ICs to be sorted according to logic speed. In addition, ICs can be speed sorted based on voltage variances. For example, each IC can be given a specific speed rating for a plurality of operating voltages. In addition, the embodiments of the present invention can be utilized to validate IC simulations with actual ICs.

The present invention may be implemented using any type of integrated circuit logic, state machines, or software driven computer-implemented operations. By way of example, a hardware description language (HDL) based design and synthesis program may be used to design the silicon-level circuitry necessary to appropriately perform the data and control operations in accordance with one embodiment of the present invention.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the invention are useful machine operations. The invention also relates to a device or an apparatus for performing these operations.

Although the foregoing invention has been described in some detail for purposes of clarity of understanding, it will be apparent that certain changes and modifications may be practiced within the scope of the appended claims. For example, an asynchronous "set" can be utilized instead of the asynchronous reset. In this embodiment, a zero can be scanned into the last scan cell and the "set" signal asserted. The output could then be monitored to determine when the last scan cell "set" itself, that is stores a one. Accordingly, the present embodiments are to be considered as illustrative and not restrictive, and the invention is not to be limited to the details given herein, but may be modified within the scope and equivalents of the appended claims.

What is claimed is:

1. A method for determining integrated circuit (IC) logic speed, comprising:
    providing a storage element having a reset input in electrical communication with a reset pin;
    asserting a reset signal at the reset pin;
    providing a delay logic in electrical communication with the reset pin and in electrical communication with the storage element, wherein the delay logic delays the reset signal for a predetermined time period; and
    measuring a reset time defined as the time period beginning when the reset signal is asserted and ending when the storage element resets, whereby the reset time being analyzed in comparison to the predetermined time period to determine a speed of the IC logic relative to a process.

2. A method as recited in claim 1, wherein the storage element is a last scan cell in a scan chain.

3. A method as recited in claim 2, wherein the scan chain comprises a plurality of scan cells, wherein a majority of scan cells include an output coupled to an input of a subsequent scan cell in the scan chain.

4. A method as recited in claim 3, further comprising an operation of comparing the reset time to a predetermined fast corner reset time and a predetermined slow corner reset time.

5. A method as recited in claim 4, further comprising an operation of correlating the IC logic speed to a simulation.

6. A method as recited in claim 1, further comprising operations of:
    changing an operating condition of an IC having the storage element; and
    measuring a reset time for the IC, wherein the IC is run using the changed operating condition.

7. A method as recited in claim 6, further comprising an operation of assigning the IC a speed rating based on each operating condition.

8. A method as recited in claim 7, wherein the operating condition is an IC operating voltage.

9. A method as recited in claim 7, wherein the operating condition is an IC operating temperature.

10. An integrated circuit (IC) having testing logic for determining IC logic speed, comprising:
    a storage element having a data input, a reset input, and a data output in electrical communication with an output pin; and
    delay logic in electrical communication with the reset input of the storage element and in electrical communication with a reset pin, the delay logic capable of delaying a reset signal to the reset pin for a predetermined time period,
    wherein the reset signal is asserted at the reset pin, and wherein a reset time is measured, the reset time being defined as the time period beginning when the reset signal is asserted and ending when the storage element resets, the reset time being analyzed in comparison to the predetermined time period for determining the IC logic speed.

11. An integrated circuit as recited in claim 10, wherein the storage element is a last scan cell in a scan chain.

12. An integrated circuit as recited in claim 11, wherein the scan chain comprises a plurality of scan cells, and wherein a majority of scan cells include an output coupled to an input of a subsequent scan cell in the scan chain.

13. An integrated circuit as recited in claim 12, wherein the reset time is compared to a predetermined fast corner reset time and a predetermined slow corner reset time.

14. An integrated circuit as recited in claim 13, wherein the IC logic speed is correlated to a simulation.

15. An integrated circuit as recited in claim 10, wherein an operating condition of the IC is changed and the reset time is measured for the IC when the IC is run using the changed operating condition.

16. An integrated circuit as recited in claim 15, wherein the IC is assigned a speed rating based on each operating voltage.

17. A scan chain system for determining integrated circuit (IC) logic speed, comprising:
    a plurality of scan cells, each scan cell having a data input, a data output, and a reset input, the plurality of scan cells including a first scan cell having a data input connected to a data input line, and a last scan cell having a data output connected to a data output line;
    delay logic connected to a reset line and the reset input of the last scan cell, the delay logic capable of delaying a reset signal from the reset line for a predetermined time period before providing the reset signal to the reset input of the last scan cell;

wherein the reset signal is asserted at the reset line, and wherein a reset time is measured, the reset time being defined as the time period beginning when the reset signal is asserted and ending when the last scan cell resets, the reset time being analyzed in comparison to the predetermined time period to determine the IC logic speed.

18. A scan chain system as recited in claim 17, wherein the reset time is compared to a predetermined fast corner reset time and a predetermined slow corner reset time.

19. A scan chain system as recited in claim 18, wherein the IC logic speed of an IC including the scan chain system is correlated to a simulation.

* * * * *